US006839958B2

United States Patent
Mannhart et al.

(10) Patent No.: US 6,839,958 B2
(45) Date of Patent: Jan. 11, 2005

(54) APPARATUS FOR MOUNTING SEMICONDUCTOR CHIPS

(75) Inventors: Eugen Mannhart, Cham (CH); Thomas Günther, Thalwil (CH); Felix Leu, Zug (CH); Tsing Dschen, Dietikon (CH)

(73) Assignee: ESEC Trading SA, Cham (CH)

( * ) Notice: Subject to any disclaimer, the term of this patent is extended or adjusted under 35 U.S.C. 154(b) by 447 days.

(21) Appl. No.: 09/951,832

(22) Filed: Sep. 12, 2001

(65) Prior Publication Data

US 2002/0031423 A1 Mar. 14, 2002

(30) Foreign Application Priority Data

Sep. 13, 2000 (CH) ..................................... 2000 1774/00

(51) Int. Cl.[7] ............................................... H05K 3/30
(52) U.S. Cl. ........................ 29/740; 739/741; 739/720; 739/732; 739/733
(58) Field of Search ........................ 29/832, 739, 740, 29/741, 720, 833

(56) References Cited

U.S. PATENT DOCUMENTS

| 4,615,093 A | 10/1986 | Tews et al. ..................... 29/407 |
| 4,653,664 A | 3/1987 | Hineno et al. .................. 221/3 |
| 4,810,154 A | 3/1989 | Klemmer et al. ........... 414/222 |
| 4,819,326 A | 4/1989 | Stannek ........................ 29/837 |
| 4,915,770 A | 4/1990 | Haeda et al. ................ 156/344 |
| 4,937,511 A | 6/1990 | Herndon et al. ........ 315/568.21 |
| 4,943,342 A | 7/1990 | Golemon ..................... 156/584 |
| 5,084,959 A | 2/1992 | Ando et al. .................... 29/740 |
| 5,131,139 A * | 7/1992 | Oyama et al. ................. 29/721 |
| 5,157,734 A | 10/1992 | Chen et al. ..................... 382/8 |
| 5,324,087 A | 6/1994 | Shimose et al. ............... 294/64 |

FOREIGN PATENT DOCUMENTS

| EP | 0 236 225 | 9/1987 |
| EP | 0 907 311 A1 | 4/1999 |

* cited by examiner

Primary Examiner—Richard Chang
(74) Attorney, Agent, or Firm—Thelen Reid & Priest LLP; David B. Ritchie

(57) ABSTRACT

An apparatus for the mounting of semiconductor chips comprises a bondhead with a pick-up tool with a longitudinal drill hole to which vacuum can be applied for the gripping and transport of a semiconductor chip. To detect whether the pick-up tool has gripped the semiconductor chip, a body with a reflecting surface is arranged in the longitudinal drill hole of the pick-up tool which, when passing over the light source on absence of the semiconductor chip deflects light shining from underneath into the longitudinal drill hole of the pick-up tool into a horizontal plane. The pick-up tool has locations which are pervious to the deflected light of the light source. At least one optical element is arranged on the bondhead which concentrates at least part of the deflected light emerging laterally from the pick-up tool onto a photosensor.

22 Claims, 2 Drawing Sheets

US 6,839,958 B2

APPARATUS FOR MOUNTING SEMICONDUCTOR CHIPS

PRIORITY CLAIM

The present application claims priority under 35 U.S.C § 119 based upon Swiss Patent Application No. 2000 1774/00 filed on Sep. 13, 2000.

FIELD OF THE INVENTION

The invention concerns an apparatus for mounting semiconductor chips.

BACKGROUND OF THE INVENTION

For the mounting of semiconductor chips, so-called die bonders are used as automatic assembly machines with which a bondhead picks up the semiconductor chip to be mounted at a first location and places it on a substrate at a second location. The bondhead has a pick-up tool with a vacuum nozzle with which the semiconductor chip is held during transport. Different measuring systems have been developed for checking whether the semiconductor chip has been successfully picked. With a first measuring system, a photosensor is located in the bondhead at the upper end of the vacuum nozzle. On the way from the first location to the substrate the pick-up tool passes over a light source which then produces a light-induced pulse in the photosensor when no semiconductor chip is located on the pick-up tool. Because of space reasons, an optimum development of the measuring system is not possible as the bondhead must fulfil various functions with the lowest possible mass.

With another known measuring system, the semiconductor chip is led through a light barrier during transport. The disadvantage with this system is that the light barrier must be adjusted exactly at the transport height.

Measurement of the strength of the vacuum in the vacuum nozzle which should be greater when the semiconductor chip has been picked and the nozzle sealed has only partially proved to be suitable because the sealing by means of the semiconductor chip is often very poor with die collet pick-up tools.

The object of the invention is to develop a measuring system which reliably detects whether a semiconductor chip is located on the pick-up tool and which does not have to be adjusted.

BRIEF DESCRIPTION OF THE INVENTION

Solving of the task is achieved with a measuring system with which the light emitted from a light source which, in the absence of a semiconductor chip, accesses the longitudinal drill hole of the pickup tool is deflected by means of an optical deflection element orthogonally radial to the longitudinal drill hole and led to a photosensor for detection. Furthermore, the measuring system is preferably envisaged with a reflector in order to deflect as large a portion of the laterally emerging light as possible onto the photosensor.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF THE INVENTION

Figure 1:
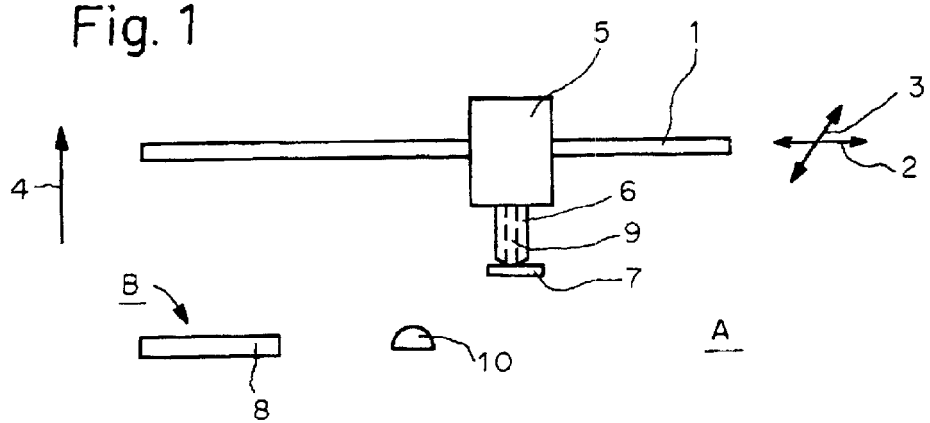
FIG. 1 shows an apparatus for the mounting of semiconductor chips with a bondhead with a pick-up tool.

FIG. 1 shows the parts necessary for understanding the invention of an apparatus for the mounting of semiconductor chips as is known, for example, from the European patent application EP 923 111. The apparatus comprises a so-called Pick and Place system 1 movable in two Cartesian co-ordinate directions 2, 3 with a bondhead 5 which can be raised and lowered in vertical direction 4 with a pick-up tool 6 for transporting a semiconductor chip 7 from a first location A to a second location B where the semiconductor chip 7 is placed on a substrate 8.

The pick-up tool 6 has a longitudinal drill hole 9 to which vacuum can be applied in order to grip the semiconductor chip 7. On the way from location A to location B, the bondhead 5 passes over a rigidly arranged light source 10. When the semiconductor chip 7 adheres to the pick-up tool 6 no light from the light source 10 passes through the longitudinal drill hole 9 when passing over the light source 10. If no semiconductor chip 7 is present on the pick-up tool 6, then light from the light source 10 passes through the longitudinal drill hole 9.

Figure 2:
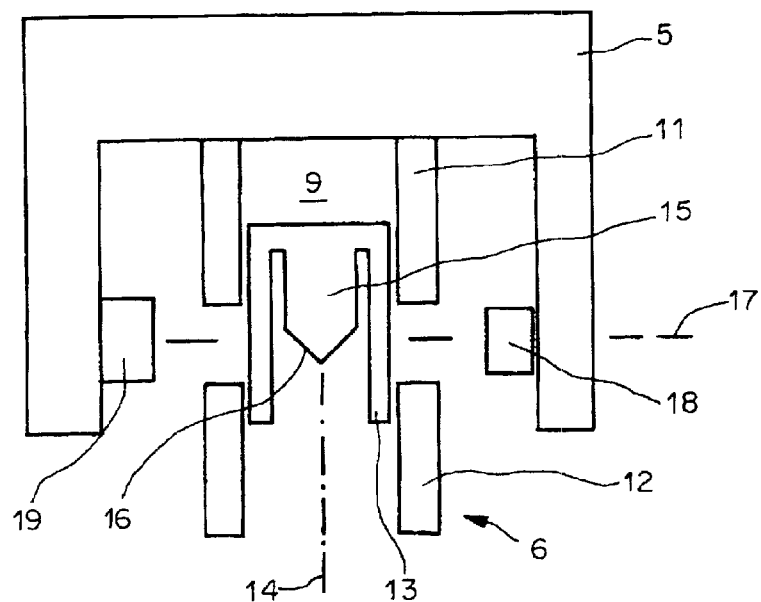
FIG. 2 shows a cross-section of the bondhead with a measuring system in accordance with the invention.

FIG. 2 shows a cross-section of the bondhead 5 with the pick-up tool 6 and a measuring system for detecting the light from the light source 10 which passes through the longitudinal drill hole 9 in the absence of the semiconductor chip 7. The pick-up tool 6 can be moved in vertical direction 4 in relation to the bondhead 5 and is rotatable on its longitudinal axis. The pick-up tool 6 comprises an upper part 11 and a lower part 12 which are both impervious to light. The upper part 11 and the lower part 12 are connected by means of a coupling piece 13 which is pervious to the light of the light source 10. The coupling piece 13 is inserted into the longitudinal drill hole 9 in the upper part 11 and into the longitudinal drill hole 9 in the lower part 12. The coupling piece 13 has a body 15 with a reflective tip 16 centred on the symmetrical axis 14 of the longitudinal drill hole 9. The tip 16 is rotationally symmetrical in relation to the longitudinal axis 14 of the longitudinal drill hole 9. The surface forming the tip 16 is, for example, conical in shape and has an angle of 45° to the vertical direction 4 so that the light shining from the light source 10 into the longitudinal drill hole 9 from underneath is deflected at the tip 16 into the horizontal plane 17 and emerges from the pick-up tool 6 laterally. A photosensor 18 for measuring the laterally emerging light and at least one optical element 19 for deflecting and/or concentrating the light emerging in the horizontal plane 17 onto the photosensor 18 are arranged on the bondhead 5. For reasons of illustrative clarity, the optical element 19 is only indicated schematically; details concerning its position and extension can be taken from the following FIGS. 3 and 5. The photosensor 18 is, for example, a photodiode or a phototransistor.

With the first embodiment, the optical element 19 is a reflector with an elliptical shape whereby the reflective tip 16 is located in one focal point 20 (FIG. 3) of the ellipse and the photosensor 18 in the other focal point 21 (FIG. 3) of the ellipse. In this way, the light emerging in the horizontal plane 17 is deflected onto the photosensor 18 regardless of the direction it takes up in the horizontal plane 17.

Figure 3:
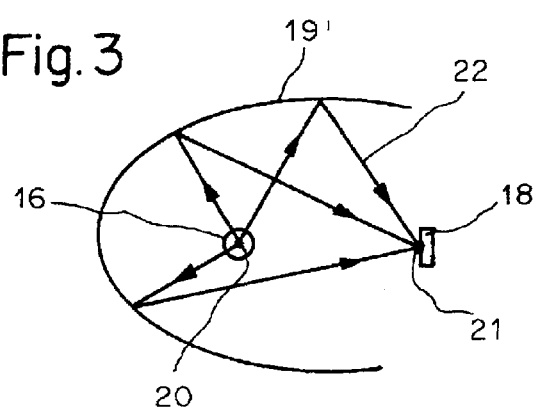
FIG. 3 shows a plan view of a first embodiment of the measuring system.

FIG. 3 shows the elliptical reflector 19', the reflective tip 16 and the photosensor 18 in a section through the horizontal plane 17. The two focal points 20 and 21 of the ellipse are also drawn as well as different beam paths 22 of the light deflected at the tip 16. The elliptical reflector 19' is not completely closed because the light reflected on it must fall on the photosensor 18 from the front. With the elliptical reflector 19', around 80% of the laterally emerging light can be concentrated onto the photosensor 18.

Figure 4:
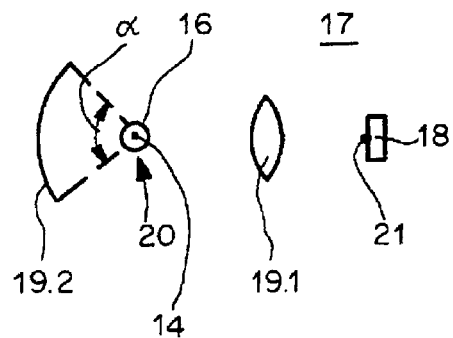
FIG. 4 shows details of the pick-up tool.

FIG. 4 shows a second embodiment with which two optical elements 19.1 and 19.2 are present in order to lead the light deflected in the horizontal plane 17 onto the photosensor 18. The first optical element 19.1 is a lens which focuses a part of the light deflected on the tip 16 onto the photosensor 18. The numerical aperture of the lens is as large as possible. With a numerical aperture of 0.5, the aperture angle amounts to 60° so that around 17% of the light emerging in the horizontal plane 17 is led to the photosensor 18. The symmetrical axis 14 penetrates the focal point 20 of the lens. The photosensor 18 is located in the focal point 21 of the lens. The second optical element 19.2 is a reflector with almost cylindrical shape and with an angle at circumference of also around 60° which reflects the light falling on it back so that it also arrives at the photosensor 18 via the lens. The reflector should reflect the light so that it passes the tip of the body 15 and reaches the lens. Because of the shadowing caused by the tip 16 of the body 15, a certain loss must be taken into account which can amount to around 10–40%. For the lens, for example, a bi-aspherical plastic lens with an anti-reflex coating can be used.

In a third embodiment, the measurement system comprises only the first optical element 19.1, i.e. the lens, but not the second optical element 19.2, i.e. the reflector, of the second embodiment. However this allows only a small fraction of the light deflected at the tip 16 to be focused on the photosensor 18.

The light emitted by the light source 10 and accessing the longitudinal drill hole 9 has a certain beam width. The light sensitive area of the photosensor 18 must therefore extend sufficiently in the vertical direction in order to acquire as much as is possible of the light originating from the light source 10. The extension of the photosensor 18 in vertical direction 4 can however be reduced when the light deflecting tip 16 of the body 15 and/or the reflectors are adapted to the characteristics of the light beams 23 (FIG. 5) emitted by the light source 10.

If, for example a commercial light-emitting diode without additional optical elements is used as the light source, then the light beams emitted from it do not run parallel but are divergent.

Figure 5:
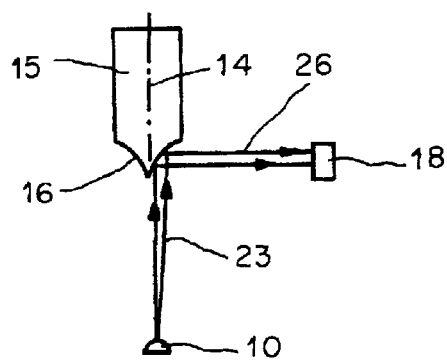
FIG. 5 shows a second embodiment of the measuring system.

The surface forming the tip 16 of the body 15 is therefore preferably curved in shape, as is shown in FIG. 5, in order to focus the light beams 26 reflected on the body 15 onto the photosensor 18 in vertical direction. With the first embodiment, the curvature must be adapted on the one hand to the divergence of the light beams 23 and, on the other hand, to the length of the beam paths 22 (FIG. 3) from the body 15 up to the photosensor 18. With the second embodiment, the curvature must be adapted on the one hand to the divergence of the light beams 23 and, on the other hand, to either the length of the path of the light beams which arrive directly at the photosensor 18 or the length of the path of the light beams which arrive via the reflector indirectly at the photosensor 18. With this example it is preferred that the surface forming the tip 16 of the body 15 is curved so that the reflected beams leave the tip of the body 15 as parallel beams 26. The advantage with this is that varying path lengths between the light beams which reach the photosensor 18 directly after reflection on the body 15 and the light beams which only reach the photosensor 18 after reflection on the reflector make no difference.

Figure 6:
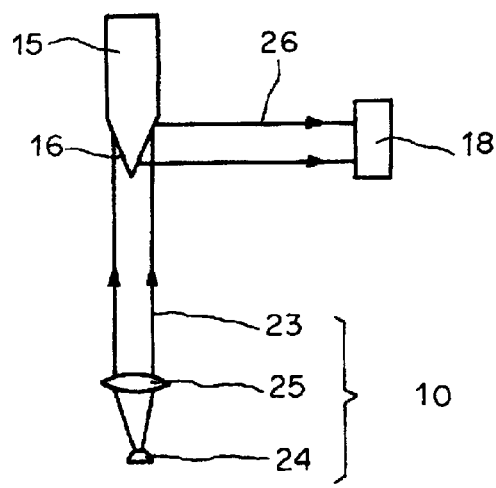
FIG. 6 shows a light source for producing parallel beams.

Another possibility exists, as is shown in FIG. 6, in using a light source 10 which emits light of almost parallel beams 23. Such a light source 10 comprises, for example, a light-emitting diode 24 and a lens 25, whereby the light-emitting diode 24 is located in the focal point of the lens 25. The reflecting surface of the body 15 is then preferably formed as a cone point so that the light 23 consisting of parallel incidence beams also leaves the body 15 as light of parallel beams 26. The reflecting surface of the body 15 can however also be curved in order to focus the light on the photosensor 18 with regard to the vertical.

With the embodiments described, the reflectors consist, for example, of mirror-finished aluminium.

In order to avoid errors caused by external light, the optical element or elements 19 and the photosensor 18 are preferably installed in light-impervious housing 19a, 18a, respectively. Furthermore, the known lock-in technique is preferably used with which the light from the light source 10 is modulated. In addition, the light source is preferably operated in pulse mode, ie, it is only switched on for short periods when the pick-up tool 6 passes the light source 10. In pulse mode, a higher current can be applied to the light source 10 than in continuous operation which increases the measuring sensitivity.

Thanks to the rotational symmetry of the tip 16, the measurement result is independent of the actual rotational position of the pick-up tool 6.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for the mounting of semiconductor chips, with a bondhead with a pick-up tool with a longitudinal drill hole to which vacuum can be applied for the gripping and transport of a semiconductor chip, and with a light source and a photosensor to detect whether the pick-up tool has gripped the semiconductor chip, whereby during transport of the pick-up tool in the absence of the semiconductor chip, light from the light source passes through the longitudinal drill hole of the pick-up tool and to the photosensor, wherein a body formed with a reflective surface is arranged in the longitudinal drill hole of the pick-up tool which deflects light shining from underneath the pick-up tool into the longitudinal drill hole of the pick-up tool into a horizontal plane, wherein the pick-up tool has locations pervious to the light of the light source and wherein at least one optical element is arranged on the bondhead which concentrates at least a part of the deflected light emerging laterally from the pick-up tool onto the photosensor.

2. The apparatus according to claim 1, wherein the optical element is a reflector in the form of an ellipse, whereby the reflecting surface of the body is arranged in a first focal point and the photosensor is arranged in a second focal point of the ellipse.

3. The apparatus according to claim 1, wherein the optical element is a lens and wherein a second optical element in the form of a reflector is present.

4. The apparatus according to claim 1, wherein the optical element is a lens and wherein the photosensor is arranged in a focal of the lens.

5. The apparatus according to claim 1, wherein the at least one optical element and the photosensor are installed in a housing which is impervious to light.

6. The apparatus according to claim 2, wherein the at least one optical element and the photosensor are installed in a housing which is impervious to light.

7. The apparatus according to claim 3, wherein the at least one optical element and the photosensor are installed in a housing which is impervious to light.

8. The apparatus according to claim 4, wherein the at least one optical element and the photosensor are installed in a housing which is impervious to light.

9. The apparatus according to claim 1, wherein the light source further comprises a lens to produce a light beam of almost parallel light beams, and wherein the light source is arranged in a focal point of the lens.

10. The apparatus according to claim 2, wherein the light source further comprises a lens is to produce a light beam of almost parallel light beams, and wherein the light source is arranged in a focal point of the lens.

11. The apparatus according to claim 3, wherein the light source further comprises a lens is to produce a light beam of almost parallel light beams, and wherein the light source is arranged in a focal point of the lens.

12. The apparatus according to claim 4, wherein the light source further comprises a lens to produce a light beam of almost parallel light beams, and wherein the light source is arranged in a focal point of the lens.

13. The apparatus according to claim 5, wherein the light source further comprises a lens to produce a light beam of almost parallel light beams, and wherein the light source is arranged in a focal point of the lens.

14. The apparatus according to claim 6, wherein the light source further comprises a lens to produce a light beam of almost parallel light beams, and wherein the light source is arranged in a focal point of the lens.

15. The apparatus according to claim 7, wherein the light source further comprises a lens to produce a light beam of almost parallel light beams, and wherein the light source is arranged in a focal point of the lens.

16. The apparatus according to claim 8, wherein the light source further comprises a lens to produce a light beam of almost parallel light beams, and wherein the light source is arranged in a focal point of the lens.

17. A semiconductor chip pick-up tool, comprising:
    a vertical aperture to which vacuum can be applied for urging the semiconductor chip into contact with the pick-up tool;
    a body fanned with a reflective surface arranged in the vertical aperture to deflect light from a light source disposed below the vertical aperture into a horizontal plane orthogonal to a symmetrical axis of the vertical aperture;
    a photosensor disposed to receive light emerging laterally from the reflective surface; and
    at least one optical element disposed in the horizontal plane and arranged to direct light deflected by the reflective surface onto the photosensor.

18. The apparatus according to claim 17, wherein the optical element is a reflector in the form of an ellipse, whereby the reflecting surface of the body is arranged in a first focal point and the photosensor is arranged in a second focal point of the ellipse.

19. The apparatus according to claim 17, wherein the optical element is a lens and wherein a second optical element in the form of a reflector is present.

20. The apparatus according to claim 17, wherein the optical element is a lens and wherein the photosensor is arranged in a focal point of the lens.

21. The apparatus according to claim 17, wherein the light source further comprises a lens to produce a light beam of almost parallel light beams, and wherein the light source is arranged in a focal point of the lens.

22. An apparatus for picking up a semiconductor chip, the apparatus comprising:
    a pick-up tool for grasping the semiconductor chip; and
    means for detecting the presence or absence of the semiconductor chip at the pick-up tool, comprising
    means for illuminating the pick-up tool from below the pick-up tool;
    means for deflecting light emitted from the means for illuminating and passing through a longitudinal drill hole of the pick-up tool into a horizontal plane orthogonal to a symmetrical axis of the means for deflecting, the means for deflecting located in the longitudinal drill hole of the pick-up tool;
    means for detecting light oriented to receive light from said means for deflecting; and
    means for concentrating deflected light onto said means for detecting, said means for concentrating disposed in the horizontal plane at a distance from said means for deflecting.

* * * * *